(12) United States Patent
Holloway

(10) Patent No.: US 8,216,885 B2
(45) Date of Patent: Jul. 10, 2012

(54) METHODS AND DEVICES FOR MANUFACTURING CANTILEVER LEADS IN A SEMICONDUCTOR PACKAGE

(75) Inventor: Jeffrey Gail Holloway, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 122 days.

(21) Appl. No.: 12/581,326

(22) Filed: Oct. 19, 2009

(65) Prior Publication Data
US 2011/0089547 A1    Apr. 21, 2011

(51) Int. Cl.
*H01L 21/44*    (2006.01)
(52) U.S. Cl. .................. 438/123; 257/E21.499
(58) Field of Classification Search .................. 438/123; 257/E21.499
See application file for complete search history.

(56) References Cited

U.S. PATENT DOCUMENTS
6,605,865 B2 * 8/2003 Jeong et al. .................. 257/670
6,867,481 B2 * 3/2005 Joshi et al. .................. 257/666

FOREIGN PATENT DOCUMENTS
JP    10-012802 A    1/1998
JP    3445930 B2    6/2003

* cited by examiner

*Primary Examiner* — Alexander Ghyka
*Assistant Examiner* — Stanetta Isaac
(74) *Attorney, Agent, or Firm* — Steven A. Shaw; W. James Brady; Frederick J. Telecky, Jr.

(57) ABSTRACT

A method of manufacturing a semiconductor package includes providing a metallic leadframe having a plurality of cantilever leads and a mounting area for mounting a die, and disposing one or more non-conductive supports adjacent to a recessed surface of the cantilever leads to support the leads during die mount, wire bond, and encapsulation processes. The method further includes mounting the die in the mounting area and electrically connecting the die to the cantilever leads, and then encapsulating at least a portion of the die, the leadframe, and the supports with an encapsulant.

19 Claims, 5 Drawing Sheets

METHODS AND DEVICES FOR MANUFACTURING CANTILEVER LEADS IN A SEMICONDUCTOR PACKAGE

FIELD OF THE INVENTION

This invention relates generally to the field of semiconductor devices and manufacture processes, and more particularly, to methods and devices for manufacturing and supporting cantilever leads in a semiconductor package.

DESCRIPTION OF THE RELATED ART

As cellular phones, mobile devices, notebook personal computers, and other miniaturized electronic devices become increasing popular, demands to reduce the size and thickness of semiconductor devices carried therein are greater than ever. These demands have been partially met through the introduction of a family of packaging commonly known as chip scale package (CSP), which has the characteristics of reduced dimensions and weight, simpler assembly process, greater performance, and a general reduction in production costs. A semiconductor package of this type carries the concept of miniaturization to the extreme, as it presents a reduced package footprint, a thin profile, and reduced weight.

A semiconductor package generally includes a die embedded within a protective resin, and such semiconductor package communicates with external components, for example, on a printed circuit board (PCB), using a variety of components such as leads or pads. Types of near-CSP semiconductor packages include small outline no-lead (SON) and quad flat pack no-lead (QFN) packages. SON and QFN packages are types of leadless leadframe packages that yield compact and reliable semiconductor packages.

A SON/QFN package has a die, which can be mounted on a die pad, positioned at or near the center of a leadframe. The die has metal bond pads located near the edges of the die. The leadframe has leads with a first end oriented away from the die and a second end oriented toward the die, where the second end is spaced from the die edges by a gap. Bond wires cross the gap to electrically connect the metal bond pads of the die to the leads. The leads have a thickness at the first end, and for a portion of the lead length near the second end, a thickness of the leads can be reduced relative to the thickness at the first end to form cantilever leads. The cantilever leads enhance adhesion of the protective resin to the leadframe and minimize delamination of the SON/QFN package by providing additional surface to which the resin can adhere.

During a wire bonding process, the cantilever leads require support because they are unsupported at the second end. An existing practice involves positioning custom-built heater block inserts under the cantilever leads to provide support. However, an inventory of custom-built inserts must be kept for different leadframe designs and new inserts may need to be purchased for new or modified leadframe designs. Another existing practice involves etching the leadframe such that the cantilever leads are thicker at their tips on the second end so the cantilever leads each has a contiguous supporting foot, or a standoff, at the second end. However, etching the leadframe so that the cantilever leads each has a standoff leaves exposed metal features at the bottom of the SON/QFN package.

SUMMARY OF THE INVENTION

Applicant has recognized that there is a need for methods and devices for supporting cantilever leads during the assembly of semiconductor packages that are more flexible and robust than existing practices such as custom-built heater block inserts or leads each etched to have a standoff. Applicant has also recognized that custom-built heater block inserts, in addition to being expensive to purchase and maintain, cannot be used during die mount and/or wire bonding processes if a layer of adhesive film has been applied to a leadframe's bottom surface, for example, by the leadframe manufacturer. Applicant has further recognized that cantilever leads etched to have standoffs leave exposed metal features at the bottom surface of a finished semiconductor package, which renders the finished semiconductor package susceptible to short circuits caused by stray solder or PCB routing metal. Therefore, it is a technical advantage to assemble semiconductor packages without the need for expensive custom-built heater block inserts or leads etched to have standoffs.

In order to develop new methods and devices for supporting dies and cantilever leads during the assembly of semiconductor packages, Applicant initially designed a full thickness and thus exposed thermal pad smaller than the die to handle the load during die placement. However, PCB routing requirements for certain applications, such as battery products, precluded the use of exposed thermal pad because routing space on the PCB was at a premium. Instead, full thickness metal standoffs were placed at the cantilever lead tips to provide support, primarily during the wire bonding process. The full thickness metal standoffs, however, resulted in exposed metal features in the assembled semiconductor packages.

Applicant recognized that if the full thickness standoffs are non-conductive, exposed metal features would be minimized, which would allow for greater PCB routing options under the assembled semiconductor packages. At first, Applicant planned to incorporate a process to place non-conductive material at the tip of each of the cantilever leads to replace the full thickness metal standoffs. However, such a process would involve a complex pattern that needs to be photo-imaged, which would be challenging to accomplish on a fully etched leadframe.

Applicant then noted that leadframes are often supplied with a layer of tape, which is typically an unpatterned rectangular piece of plastic that is peeled off the leadframe subsequent to the molding process. Applicant considered this layer of tape as a good canvas on which the non-conductive material can be painted or applied to form one or more supports for supporting the cantilever leads. Correctly shaped, the non-conductive supports would remain in the molded semiconductor package. While considering the shapes of the non-conductive supports, Applicant realized that the footprint of the supports was no longer a restrictive factor with respect to PCB routing options because they were non-conductive. Therefore, the supports could fill in below the full lead or extend from lead to lead and support one or more cantilever leads against vertical motion and other undesired movement during the die mounting, wire bonding, and molding processes.

In this manner, the cantilever leads are supported using one or more non-conductive supports during the assembly of a semiconductor package from a leadframe. The leadframe has a die mounting area in or over the center of the leadframe, which can include a die pad, and cantilever leads with a first end oriented away from the mounting area and a second end oriented toward the mounting area. The leadframe can accommodate a range of die sizes. For example, the die can be larger or smaller than a center area defined by the second end of the cantilever leads. If the die is larger than the center area, then the die can be mounted over the center area and a portion of the cantilever leads at the second end. If the die is smaller than the center area, then the die can be mounted in the center area such that the second end of the cantilever leads is spaced from the edges of the die by a gap. The cantilever leads have a thickness at the first end, and for a portion of the lead length near and at the second end, a thickness of the leads is reduced relative to the thickness at the first end to form a recessed surface.

More particularly, the non-conductive supports are attached, applied, adhered, or disposed adjacent to the recessed surface of the cantilever leads at or near the second end to support the cantilever leads. If an adhesive film is used during package assembly, then the supports are attached or applied prior to or while adhering the adhesive film to the leadframe. The supports can be in any suitable configuration, such as a square or rectangular ring, one or more bars, multiple standoffs each supporting one or a few leads, or the like. The supports can comprise any non-conductive material having sufficient rigidity to support the leads, such as ceramic, plastic, anodized metal, or the like.

Using non-conductive supports to support cantilever leads eliminates the need for expensive custom-built heater block inserts or an inventory thereof for various leadframe designs, which results in greater processing flexibility, better cantilever lead support during various stages of package assembly, and cost savings. Using non-conductive supports also enhances the robustness and yield of integrated circuits and devices that incorporate the semiconductor package by minimizing exposed metal features thereon, which reduces features that can be short-circuited and allows greater PCB routing options under the semiconductor package.

Additional embodiments will be set forth in part in the description which follows, and in part will be obvious from the description, or may be learned by practice of the disclosed embodiments. Embodiments will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

FIG. 4A is a cross sectional view along either 5-5 in FIG. 5, 6-6 in FIG. 6, or 7-7 in FIG. 7, and FIGS. 4B-D illustrate other embodiments thereof;

FIGS. 5-7 are bottom surface views of the QFN packages illustrating exemplary configurations of the non-conductive supports.

DETAILED DESCRIPTION

Reference will now be made in detail to the exemplary embodiments, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which may be practiced. These embodiments are described in sufficient detail to enable those skilled in the art to practice these embodiments and it is to be understood that other embodiments may be utilized and that changes may be made without departing from the scope of the invention. The following description is, therefore, merely exemplary.

Notwithstanding that the numerical ranges and parameters setting forth the broad scope of the exemplary embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
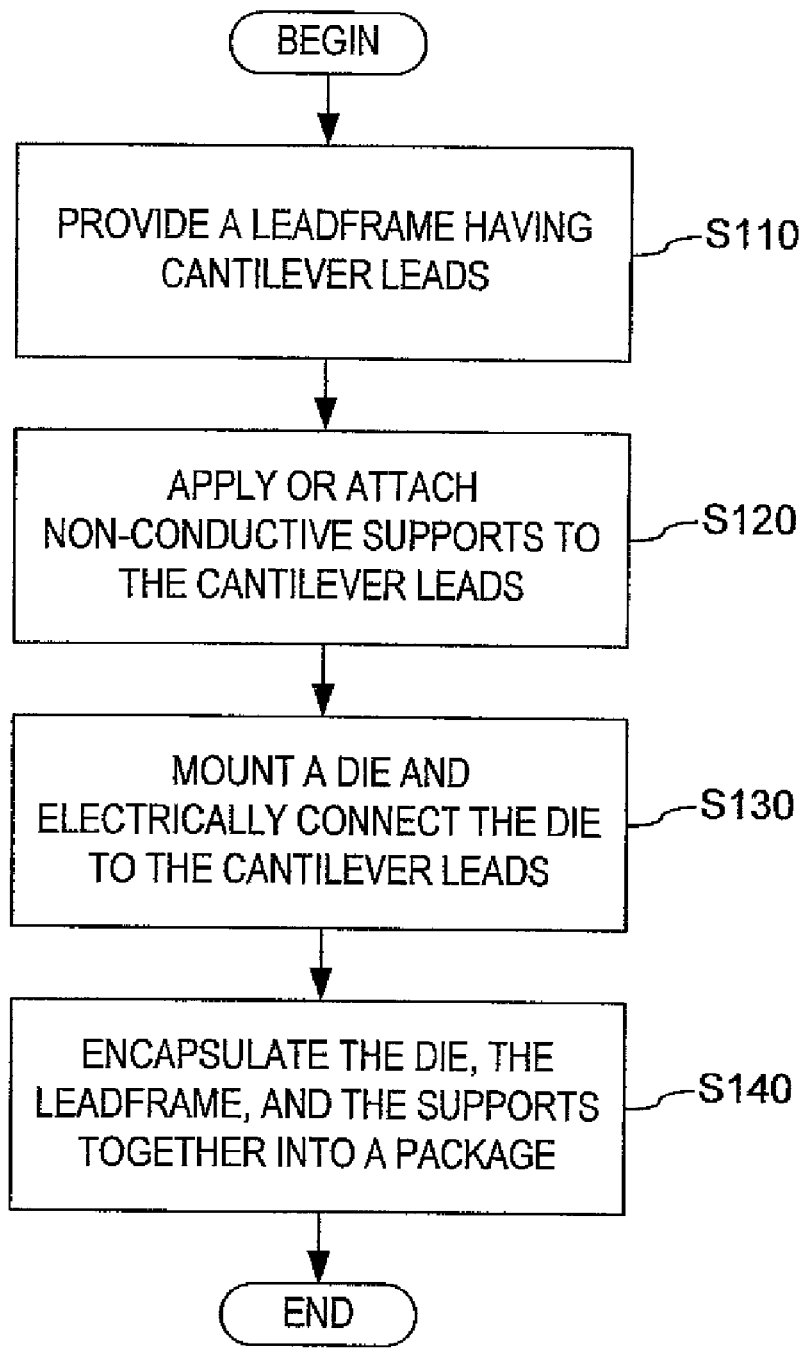
FIG. 1 is a flow chart illustrating the manufacture of a semiconductor package according to various embodiments of the invention.

FIG. 1 is a flow chart illustrating the manufacture of a semiconductor package according to various embodiments of the invention. The semiconductor package can be, for example, a chip scale package (CSP) or near-CSP, and can include at least one semiconductor die and a leadframe embedded within a protective encapsulant. In the present embodiments, the semiconductor package is prepared by encapsulating a leadframe with at least one die mounted on or in the leadframe en bloc with an encapsulant such as a resin or other molding compounds. The operation includes, but is not limited to, the following processing steps: a processing step S110 in which a leadframe having cantilever leads and a die mounting area is provided; a processing step S120 in which one or more non-conductive supports are applied, attached, adhered, or disposed adjacent to a recessed surface of the cantilever leads; a processing step S130 in which the die is mounted on the die mounting area and electrically connected to the cantilever leads, during which the cantilever leads are supported by the non-conductive supports; and a processing step S140 in which the die, the leadframe, and the non-conductive supports are encapsulated with an encapsulant to form the semiconductor package.

Figure 2A:
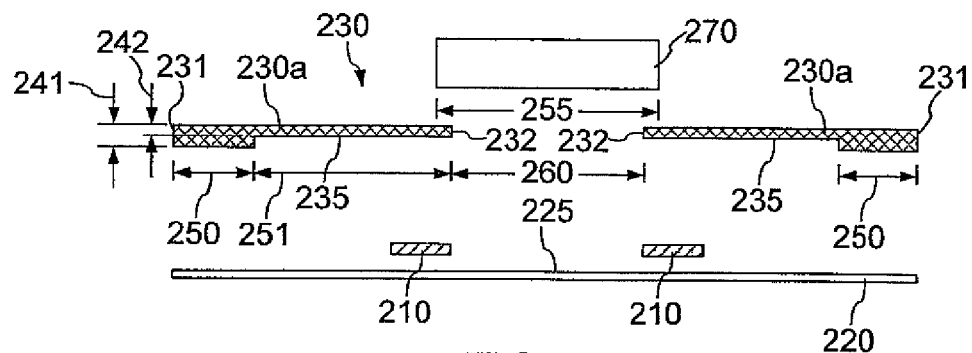
FIGS. 2A-D are schematic cross sectional views of a semiconductor package being formed from a leadframe having cantilever leads supported by non-conductive supports, in accordance with various embodiments of the invention.

FIGS. 2A-D are schematic cross sectional views of a semiconductor package being formed from a leadframe having cantilever leads supported by non-conductive supports, in accordance with various embodiments of the invention. As shown in FIG. 2A, the semiconductor package contains one or more non-conductive supports 210, a metallic leadframe 230, and a semiconductor die 270. Leadframe 230 can be made of any suitable metal or metal alloy, such as copper or a copper alloy (e.g., Olin C7025), an iron-nickel alloy (e.g., 42 Alloy), or the like, or any combination thereof. Further, to enhance leadframe adhesion to the encapsulant (e.g., an encapsulant 280), to improve external leadframe solderability, or to enhance other characteristics or processes such as wire stitch attach, portions of leadframe 230 can be plated with another metal layer such as nickel, palladium, tin, silver, solder, or the like. A typical leadframe thickness ranges from about 75 to 250 μm. However, some devices may require thinner, or thicker, materials.

Leadframe 230 includes multiple cantilever leads 230a each having a first end 231 oriented away from die 270 and a second end 232 oriented toward die 270. Cantilever leads 230a can be formed by stamping or etching leadframe 230 to the desired shape and thickness. Cantilever leads 230a each has a first thickness 241 at a first portion 250 adjacent to first end 231 and a second thickness 242 at a second portion 251 adjacent to second end 232, to form a recessed surface 235 adjacent to second end 232. First thickness 241 is greater than second thickness 242. For example, first thickness 241 can be between about 150 and 200 μm, while second thickness 242 can be between about 75 and 100 μm. Moreover, the lead length of cantilever leads 230a having second thickness 251 can further exhibit reduced width.

Leadframe 230 includes a die mounting area 255 on which die 270 can be mounted. Leadframe 230 can accommodate a range of die sizes. For example, die 270 can be larger or smaller than a center area 260 defined by second end 232 of cantilever leads 230a. According to various embodiments and as shown in FIG. 2A, the width of die 270 can be greater than the width of center area 260 of leadframe 230. In those embodiments and as shown in FIGS. 2B-D, 3A-C, 4A, and 4B, die 270 can be mounted over center area 260 and on die mounting area 255 such that the edges of die 270 are mounted on top of at least a portion of cantilever leads 230a. According to other embodiments, the width of die 270 can be smaller than the width of center area 260. In those embodiments and as shown in FIGS. 4C and 4D, die 270 can be mounted within center area 260 and on die mounting area 255 such that the edges of die 270 are spaced from second end 232 of cantilever leads 230a by a gap 452.

Non-conductive supports 210 are applied, attached, adhered, or disposed adjacent to recessed surface 235 at or near second end 232 of cantilever leads 230a to support cantilever leads 230a during die mount, wire bond, and/or encapsulation processes. Supports 210 can comprise any electrically non-conductive material having sufficient rigidity to support cantilever leads 230a of leadframe 230 during package assembly, such as ceramic, plastic, anodized metal, or the like, or any combination thereof. Supports 210 can remain in the assembled package, examples of which are shown in FIGS. 3A-C, 4A-D, and 5-7 and further described infra. Moreover, supports 210 can have any suitable planar configuration, such as a square or rectangular ring, one or more bars, multiple standoffs each supporting one or a few leads, or the like, examples of which are shown in FIGS. 5-7 and further described infra.

According to various embodiments, supports 210 can be applied or adhered to or placed on a surface 225 of a layer 220 prior to attaching or adhering layer 220 to one side of leadframe 230. Layer 220 can be an adhesive tape or film, a non-adhesive tape or film, or any type of structure having a surface that can be adhered or attached to leadframe 230 and/or die 270. Layer 220 can include, for example, polyimide tape, NITTO tape, HITACHI tape, and the like. Alternatively, prior to attaching or adhering supports 210 and leadframe 230 and/or die 270 onto layer 220, supports 210 can be attached, adhered, or coupled to recessed surface 235 at or near second end 232 of cantilever leads 230a using an adhesive material such as acrylic, epoxy, polyimide, or the like.

Supports 210 can be attached or adhered to layer 220 and/or leadframe 230 by a leadframe manufacturer or a package assembler. If the leadframe manufacturer applies an adhesive film to leadframe 230, then the manufacturer can attach or apply non-conductive supports 210 on the adhesive film prior to providing leadframe 230 to the package assembler. If the package assembler applies an adhesive film to leadframe 230 during package assembly, then the assembler can attach or apply non-conductive supports 210 prior to or while applying the adhesive film to leadframe 230. Alternatively, non-conductive supports 210 can be adhered, applied, or coupled to cantilever leads 230a of leadframe 230 without using an adhesive film. A combined thickness of supports 210 and cantilever leads 230a at second end 232 is substantially equal to first thickness 241.

Die 270 can be mounted on die mounting area 255 prior to or subsequent to applying or adhering layer 220 to supports 210 and leadframe 230. For example, after supports 210 and leadframe 230 are securely attached or adhered to layer 220, die 270 can be mounted by adhering or attaching die 270 to cantilever leads 230a using an adhesive material or solder, or by adhering die 270 to layer 220 using an adhesive material or thermo-compression. Alternatively, after supports 210 are attached or adhered to either leadframe 230 or layer 220, die 270 can be mounted while leadframe 230 is being applied or adhered to layer 220.

Figure 2B:
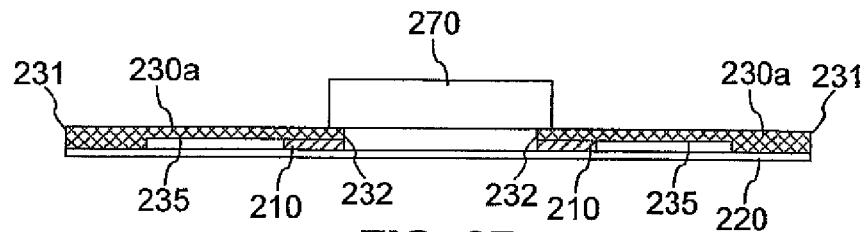
Figure 3A:
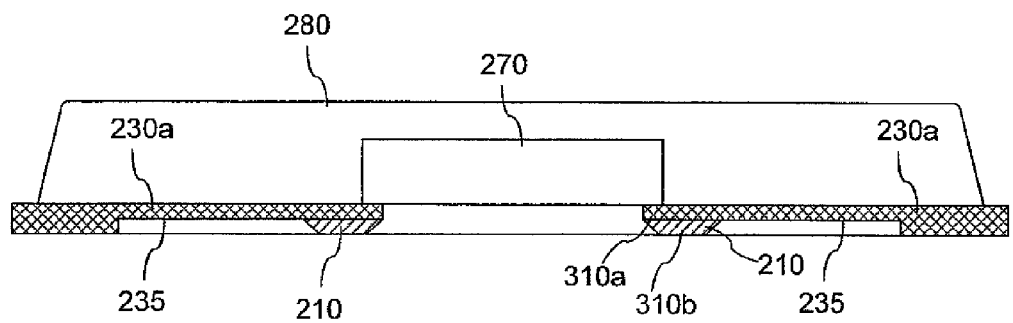
FIGS. 3A-C are schematic cross sectional views of semiconductor packages formed from a leadframe having cantilever leads supported by shaped non-conductive supports, in accordance with various embodiments of the invention.
Figure 3B:
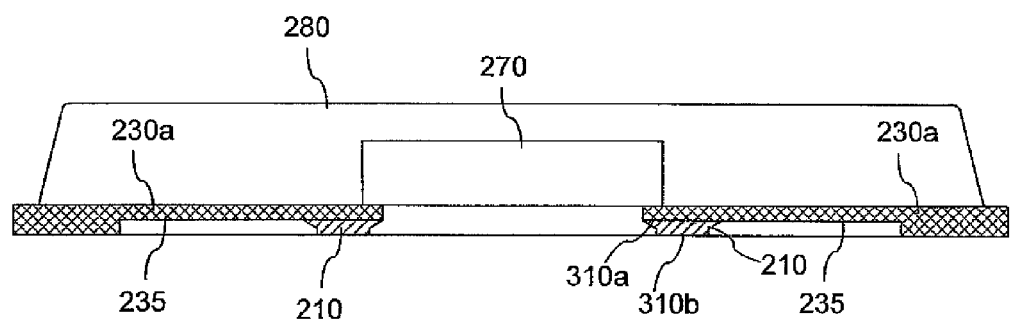
Figure 3C:
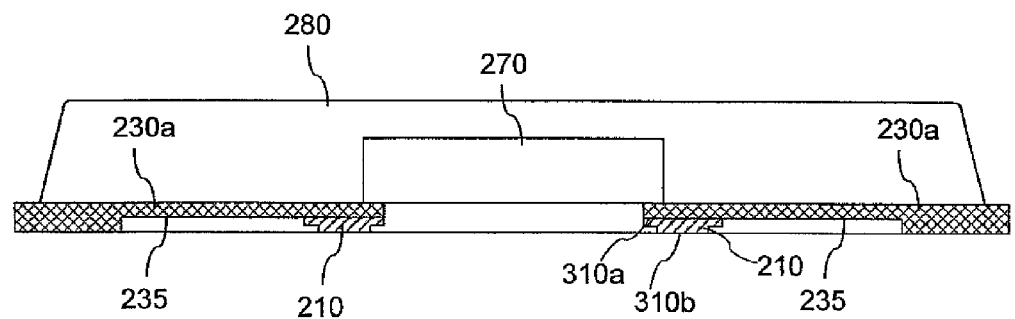

As shown in FIG. 2B and according to various embodiments, die 270 can be mounted on die mounting area 255 of leadframe 230 such that the edges of die 270 are mounted on top of at least a portion of cantilever leads 230a. Die 270 can be patterned with small attachment pads of metal (e.g., solder, solder paste, and the like) that serve as connections to leadframe 230. The attachment pads can be metalized to make them more suitable for attaching to cantilever leads 230a of leadframe 230, in which a small dot of metal is deposited on each of the pads. The attachment pads can be used to electrically and/or mechanically couple die 270 directly to leadframe 230, in lieu of wire bonds or other types of connectors. Die 270 can then be positioned to align the attachment pads onto cantilever leads 230a. The metal dots on the attachment pads are melted to produce an electrical connection between die 270 and cantilever leads 230a.

Figure 2C:
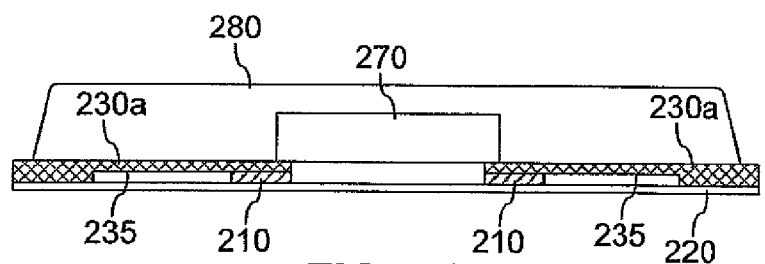
Figure 2D:
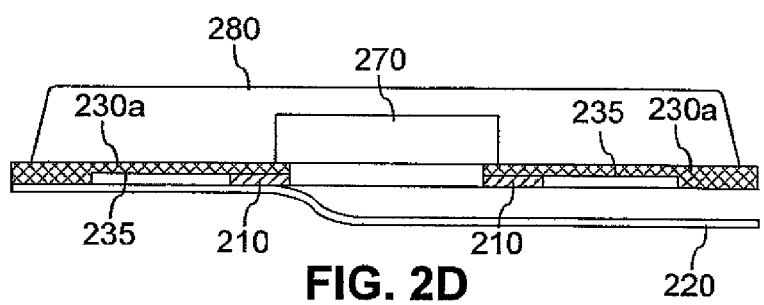

Next, as shown in FIG. 2C, an encapsulant 280 can be used to encapsulate at least a portion of die 270, leadframe 230, and supports 210. Encapsulant 280 can be made of epoxy, epoxy resin compound, or other molding compound known in the art. Recessed surface 235 at second portion 251 of cantilever leads 230a serves as an anchor for encapsulant 280, as the additional lead surface enhances adhesion and helps to prevent delamination of the semiconductor package. Finally, as shown in FIG. 2D, subsequent to encapsulation, layer 220 is separated from the semiconductor package, which includes die 270, leadframe 230, and supports 210 that are at least partially encapsulated in encapsulant 280.

Supports 210 can remain in the assembled semiconductor package without leaving exposed conductive features at the bottom of the semiconductor package. The footprint of supports 210 in the assembled semiconductor package is not a restrictive factor with respect to PCB routing options because supports 210 are non-conductive. Therefore, supports 210 can fill in below the full lead or extend from lead to lead of cantilever leads 230a, and each of supports 210 can support one or more of cantilever leads 230a against vertical motion and other undesired movement during the die mounting, wire bonding, and molding processes. Using non-conductive supports 210 also enhances the robustness and yield of integrated circuits and devices that incorporate the assembled semiconductor package by minimizing exposed conductive features thereon, thus reducing features that can be short-circuited.

According to various embodiments of the invention, non-conductive supports 210 can be fixed or secured in the assembled semiconductor package using one or a combination of techniques. An exemplary technique involves attaching, adhering, or coupling supports 210 to recessed surface 235 of cantilever leads 230a using an adhesive material such as acrylic, epoxy, polyimide, or the like. Another exemplary technique involves treating surfaces of supports 210 to enhance adhesion between supports 210 and encapsulant 280. Surface treatment includes mechanical roughening, plasma etching, coating or doping with chemical adhesion promoters, and the like. Yet another exemplary technique involves securing or anchoring supports 210 within encapsulant 280 by shaping supports 210, as illustrated in FIGS. 3A-C, so that an internal portion 310a is wider than an exposed portion 310b. The shapes of supports 210 shown in FIGS. 3A-C are merely exemplary, and one skilled in the art will recognize that other shapes for securing supports 210 within encapsulant 280 are possible without departing from the scope of the invention.

Figure 4A:
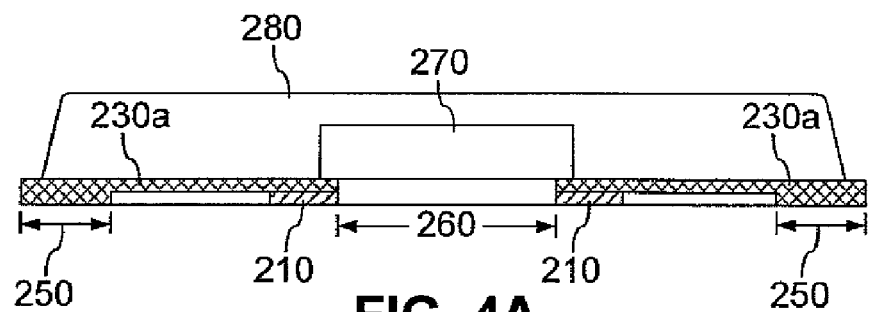
FIGS. 4A-D and 5-7 illustrate exemplary quad flat pack no-lead (QFN) packages formed according to various embodiments of the invention.
Figure 4B:
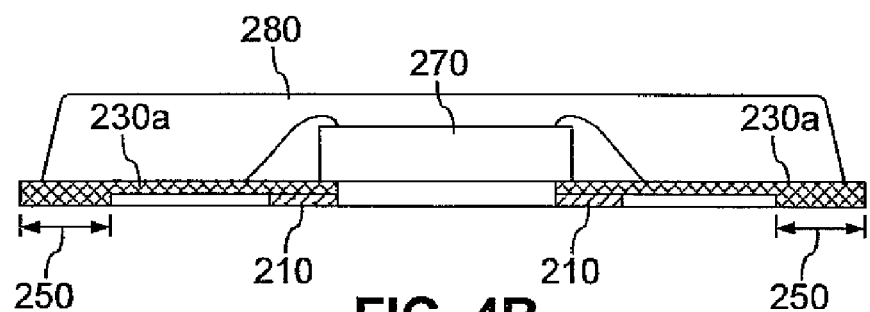
Figure 4C:
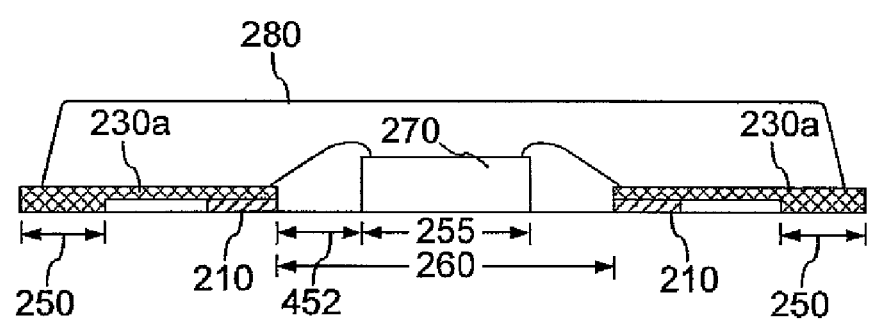
Figure 4D:
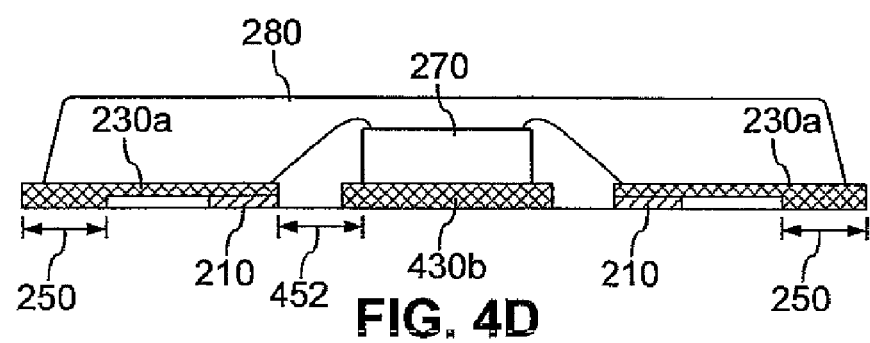
Figure 5:
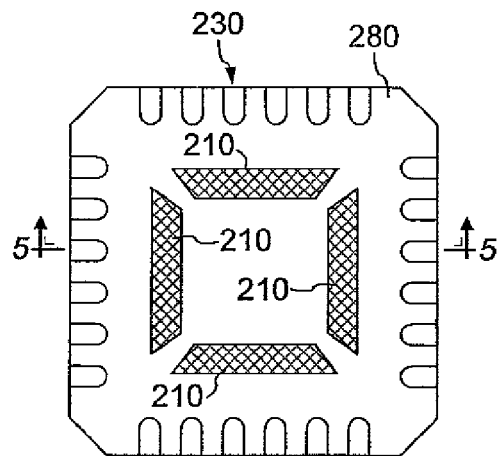
Figure 6:
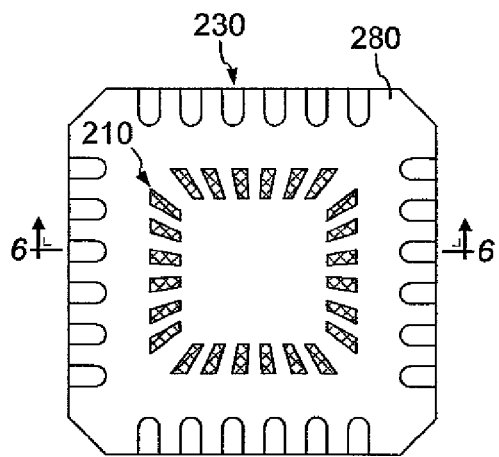
Figure 7:
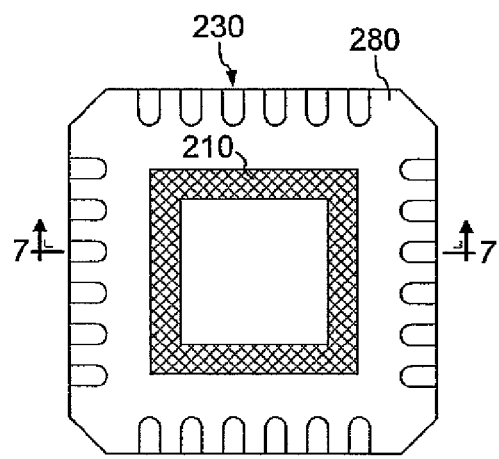

FIGS. 4A-D and 5-7 illustrate exemplary quad flat pack no-lead (QFN) packages formed according to various embodiments of the invention. In the exemplary QFN packages and as shown in FIGS. 4A-D, first portion 250 of cantilever leads 230a forms lead pads that provide electrical contact to external components and also serve as an attachment surface, either by pressure contact or by soldering. FIG. 4A provides a cross sectional view of an exemplary QFN package along either 5-5 in FIG. 5, 6-6 in FIG. 6, or 7-7 in FIG. 7. FIGS. 4B-D illustrate variations of the QFN package as shown in FIG. 4A.

FIG. 4A illustrates an exemplary QFN package in which the width of die 270 is greater than the width of center area 260 of leadframe 230, and thus die 270 is mounted on die mounting area 255 and atop cantilever leads 230a. Flip chip assembly or other similar techniques known to one skilled in the art can be utilized to mount and electrically connect die 270 to leadframe 230. For example, die 270 can be patterned with small attachment pads of metal (e.g., solder, solder paste, and the like) that serve as connectors to leadframe 230. The attachment pads can be metalized to make them more suitable for attaching to cantilever leads 230a of leadframe 230, in which a small dot of metal is deposited on each of the pads. In lieu of wire bonds or other types of external connectors, the attachment pads are used to electrically and/or mechanically couple die 270 directly to leadframe 230. Die 270 can then be positioned to align the attachment pads onto cantilever leads 230a. The metal dots on the attachment pads are melted to produce an electrical connection between die 270 and cantilever leads 230a.

FIG. 4B illustrates an exemplary QFN package similar to that shown in FIG. 4A, except die 270 is electrically connected to leadframe 230 by wire bonding or other similar techniques known to one skilled in the art. During the wire bonding process, cantilever leads 230a are supported by supports 210. The length of the bond wires depends on various design factors, such as the size and height of die 270, and can range between, for example, 1000 and 1500 µm.

FIG. 4C illustrates another exemplary QFN package assembled according to an embodiment of the invention, in which the width of die 270 is smaller than the width of center area 260 of leadframe 230, and thus die 270 is mounted on die mounting area 255 within center area 260. After leadframe 230 and die 270 are fixed relative to each other, for example, by being attached or adhered to layer 220, second end 232 of cantilever leads 230a is spaced from the edges of die 270 by gap 452. Die 270 is electrically connected to leadframe 230 by wire bonding or other similar techniques known to one skilled in the art. For example, bond pads of die 270 can be wire bonded to cantilever leads 230a at or near second end 232. During the wire bonding process, cantilever leads 230a are supported by supports 210. The length of the bond wires depends on the various design factors, such as the width of gap 452 and the size and height of die 270, and can range between, for example, 1000 and 1500 µm. FIG. 4D illustrates an exemplary semiconductor package assembled using another embodiment of the invention, in which die 270 is mounted on a die pad 430b, and die 270 is fully enclosed within the assembled package while die pad 230b is partially exposed. Die 270 can be mounted on die pad 430b, for example, by attaching die 270 to die pad 430b using an adhesive material such as acrylic, epoxy, polyimide, or the like.

FIGS. 5-7 are bottom surface views of the semiconductor package assembled according to various embodiments of the invention. The semiconductor package is illustrated as a QFN package in FIGS. 5-7, but can be in any of various CSP or near-CSP layouts known in the art, such as SON and the like. FIG. 5 illustrates an exemplary planar configuration of supports 210 in the form of four bars disposed parallel and equidistant to corresponding edges of die 270 (not shown). FIG. 6 illustrates an exemplary planar configuration of supports 210 in the form of multiple standoffs that each supports a corresponding one of cantilever leads 230a of leadframe 230. FIG. 7 illustrates an exemplary planar configuration of one non-conductive support 210 in the form of a square ring disposed around die 270 (not shown). The planar configurations as described above and illustrated in FIGS. 5-7 are merely exemplary, and other configurations, such as a rectangular or circular ring, are possible without departing from the scope of the invention.

Other embodiments of the present teaching will be apparent to those skilled in the art from consideration of the specification and practice of the exemplary embodiments disclosed herein. It is intended that the specification and examples be considered as exemplary only, with a true scope and spirit of the invention being indicated by the following claims.

What is claimed is:

1. A method of manufacturing a semiconductor package which contains a semiconductor die and a metallic leadframe, comprising:
    providing the leadframe having a mounting area for mounting the die and a plurality of cantilever leads with a first end oriented away from the mounting area and a second end oriented toward the mounting area, wherein the cantilever leads each has a first thickness at the first end and a second thickness at the second end to form a recessed surface at the second end, the first thickness being greater than the second thickness;
    disposing one or more non-conductive supports adjacent to the recessed surface of the cantilever leads to support the cantilever leads;
    electrically connecting a plurality of bond pads of the die to the cantilever leads at the second end, wherein the die is mounted in the mounting area; and
    encapsulating at least a portion of the die, the leadframe, and the supports with an encapsulant.

2. The method of claim 1, wherein disposing one or more non-conductive supports adjacent to the recessed surface of the cantilever leads further comprises:
    disposing the supports on a film; and disposing the leadframe on the film such that the recessed surface of the cantilever leads are disposed adjacent to at least one of the supports.

3. The method of claim 1, wherein disposing one or more non-conductive supports adjacent to the recessed surface of the cantilever leads further comprises:
coupling the supports to the leadframe; and
simultaneously disposing the leadframe and the supports to a film.

4. The method of claim 1, wherein a first portion of the supports adjacent to the recessed surface of the cantilever leads is wider than a second portion of the supports not adjacent to the recessed surface of the cantilever leads.

5. The method of claim 1, wherein surfaces of the supports are mechanically roughened, plasma etched, coated with adhesion promoters, or doped with adhesion promoters.

6. The method of claim 1, wherein a configuration of the supports comprises a ring.

7. The method of claim 1, wherein a configuration of the supports comprises one or more bars.

8. The method of claim 1, wherein a configuration of the supports comprises a plurality of individual standoffs for supporting the cantilever leads, each of the standoffs supporting one or more of the cantilever leads.

9. The method of claim 1, wherein a material of the supports comprises ceramic, plastic, or anodized metal.

10. The method of claim 1, wherein a combined thickness of the supports and the cantilever leads at the second end is substantially equal to the first thickness.

11. The method of claim 1, wherein the die is mounted on a die pad in the mounting area of the leadframe, and wherein encapsulating further comprises encapsulating at least a portion of the die pad.

12. A method of manufacturing a semiconductor package, which contains a semiconductor die and a metallic leadframe, comprising:
affixing the semiconductor die on a die pad portion of the leadframe, placing a non-conductive supporting member underneath a first end of a cantilever lead; and wire-bonding the cantilever lead to a bond pad on the semiconductor die.

13. The method of claim 12, further comprising molding the semiconductor die and the bond-wire with an encapsulant, exposing a surface of the nonconductive supporting member.

14. The method of claim 12, in which the non-conductive supporting member supports a second cantilever lead.

15. The method of claim 14, in which the non-conductive supporting member is a ring.

16. The method of claim 14, in which the non-conductive supporting member is a bar.

17. The method of claim 12, in which the non-conductive supporting member includes ceramic, plastic, or anodized metal.

18. The method of claim 12, in which the combined thickness of the supporting member and the cantilever lead at the first end is substantially equal to the thickness of the cantilever lead at a second end.

19. The method of claim 18, further comprising molding the semiconductor die and the bond-wire with an encapsulant, exposing a surface of the nonconductive supporting member and a surface of the second end of the cantilever lead.

* * * * *